United States Patent [19]

Twynam et al.

[11] Patent Number: 5,508,536
[45] Date of Patent: Apr. 16, 1996

[54] HETEROJUNCTION BIPOLAR TRANSISTOR HAVING LOW ELECTRON AND HOLE CONCENTRATIONS IN THE EMITTER-BASE JUNCTION REGION

[75] Inventors: John K. Twynam, Tenri; Katsuhiko Kishimoto, Nara; Toshiaki Kinosada, Izumi, all of Japan

[73] Assignee: Sharp Kabushiki Kaisha, Osaka, Japan

[21] Appl. No.: 224,650

[22] Filed: Apr. 7, 1994

[30] Foreign Application Priority Data

Apr. 7, 1993 [JP] Japan .................................. 5-080760

[51] Int. Cl.$^6$ ................. H01L 31/0328; H01L 31/0336; H01L 31/072
[52] U.S. Cl. ............................ 257/197; 257/191; 257/198
[58] Field of Search ................................ 257/197, 198, 257/191; 437/22, 31

[56] References Cited

U.S. PATENT DOCUMENTS

| 4,728,616 | 3/1988 | Ankri et al. | 437/22 |
| 4,768,074 | 8/1988 | Yoshida et al. | 257/191 |
| 5,162,243 | 11/1992 | Streit et al. | 437/31 |

FOREIGN PATENT DOCUMENTS

| 0106724 | 4/1984 | European Pat. Off. | 257/197 |
| 0562272 | 9/1993 | European Pat. Off. | 257/191 |

OTHER PUBLICATIONS

Chung-Chang Wu et al. "High Gain Npn AlGaAs/GaAs Heterojunction Bipolar Transisitor Prepared by Molecular Beam Epitaxy", *Jpn. J. Appl. Phys.*, Part 2, vol. 31 (1992), pp. L 385–L 387.

K. Ikossi-Anastasiou et al. "Low–Temperature Characterization of High–Current–Gain Graded–Emitter AlGaAs/GaAs Narrow–Base Heterojunction Bipolar Transistor", *IEEE Electron Device Letters*, vol. 13 (1992), pp. 414–417.

Enrico Zanoni, "Negative Base Current and Impact Ionization Phenomena in AlGaAs/GaAs HBT's", IEEE Electron Device Letters, vol. 13, No. 5, May 1992, pp. 253–255.

D. L. Miller, et al., "(GaAl) As/GaAs Heterojunction Bipolar Transistors With Graded Composition in the Base", Electronics Letters, vol. 19, No. 10 May 1983, pp. 367–368.

*Primary Examiner*—Steven H. Loke
*Attorney, Agent, or Firm*—David G. Conlin; Kevin J. Fournier

[57] ABSTRACT

The present invention provides a heterojunction bipolar transister includes: a collector layer, a base layer, an emitter layer, a transition layer formed between the base layer and the emitter layer, a collector electrode connected to the collector layer, a base electrode connected to the base layer, and an emitter electrode connected to the emitter layer, wherein the emitter layer and the transition layer are formed of a composition including elements forming the base layer and at least one element different from the elements forming the base layer, a composition of the different element in the transition layer at the emitter side is substantially equal to that of the emitter layer, a composition of the different element in the transition layer at the base side is smaller than that of the emitter side and varies abruptly towards the base layer, and the composition of the transition layer gradingly varies from the base side to the emitter side.

6 Claims, 4 Drawing Sheets

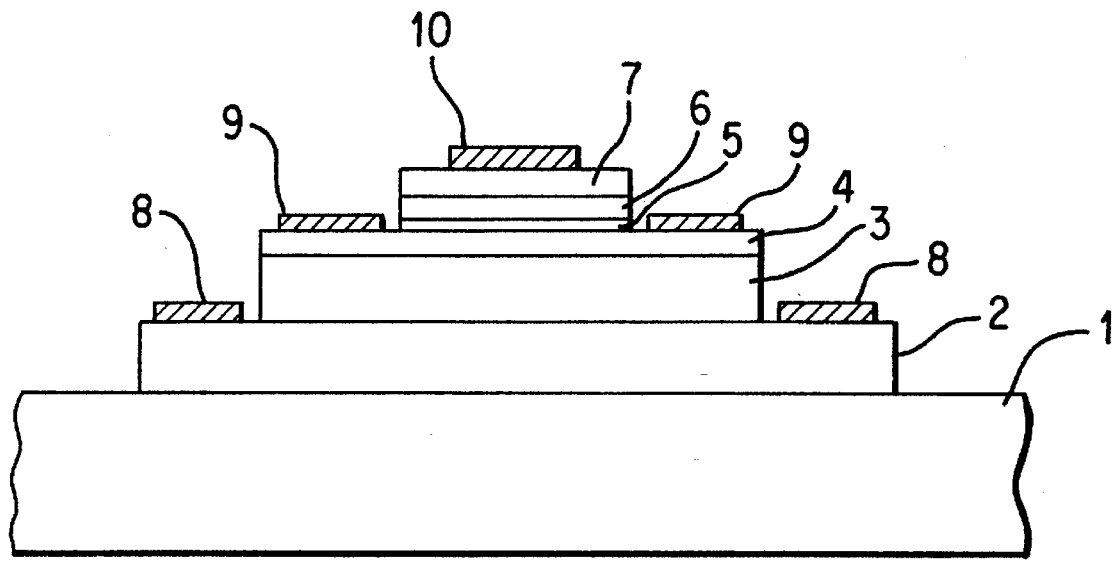
F I G. 1
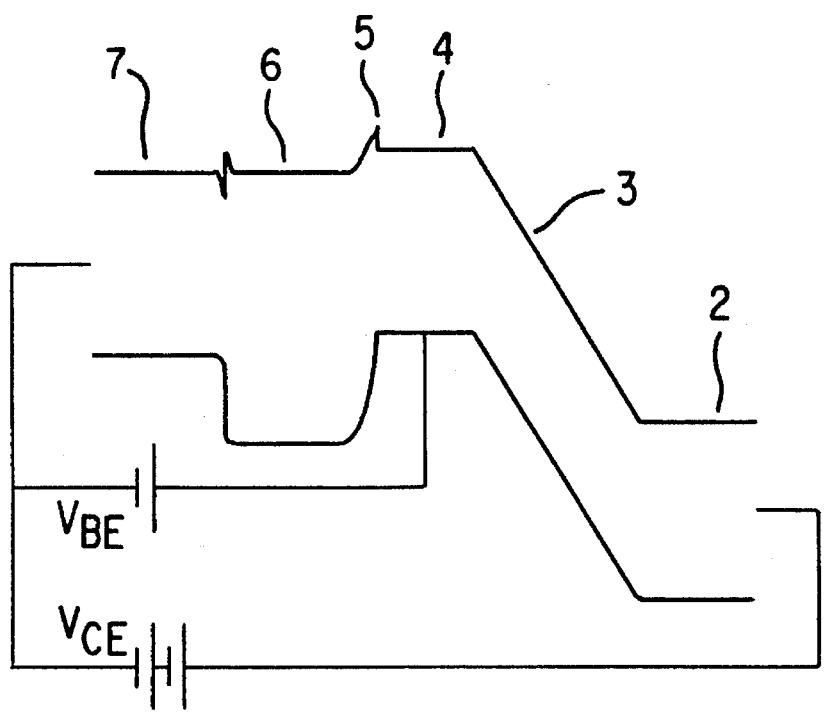
F I G. 2

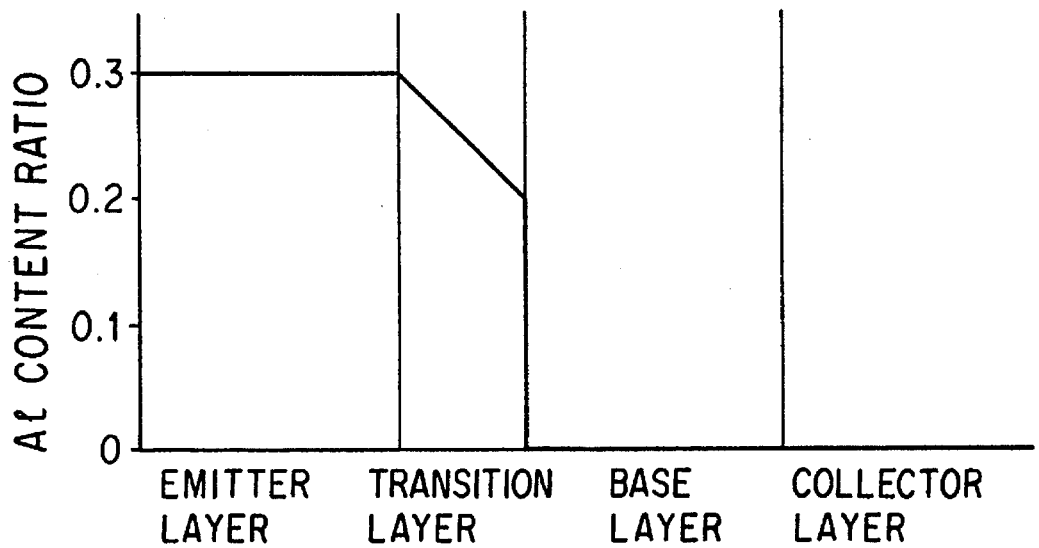
F I G. 3

HETEROJUNCTION BIPOLAR TRANSISTOR HAVING LOW ELECTRON AND HOLE CONCENTRATIONS IN THE EMITTER-BASE JUNCTION REGION

BACKGROUND OF THE INVENTION

1. Field of the Invention

The invention relates to a heterojunction bipolar transistor. In particular, it relates to a heterojunction bipolar transistor in which the material composition of the emitter-base heterojunction region is graded, thereby resulting in a high reliability.

2. Description of the Related Art

Conventionally, an AlGaAs/GaAs heterojunction bipolar transistor is formed using a semi-insulating GaAs substrate, doped GaAs base and collector layers and a doped AlGaAs emitter layer. In such a conventional heterojunction bipolar transistor, the material composition of the emitter-base junction region is varied to achieve the desired electric potential barrier. For example, in a device having an emitter-base junction region of which the composition is graded linearly or parabolically, the aluminum content is varied in the emitter-base junction region, namely a transition layer is provided between the emitter layer and base layer as shown by a broken line A in FIG. 4. In the case of a device having an emitter-base junction region of which the composition is graded abruptly, the aluminum content is varied as shown by a solid line B.

Hereinafter, the conventional NPN-type device having an emitter-base junction region of which the composition is graded linearly or abruptly is described in detail with reference to figures. Herein, the term "a grading or abrupt emitter-base junction region" refers to the emitter-base junction region which includes the emitter, transition and base layers and of which the composition is graded linearly, graded parabolically or changes abruptly.

FIG. 5 shows a bipolar transistor having an emitter-base junction region in which the aluminum composition is graded linearly. The bipolar transistor of FIG. 5 has the following layers sequentially formed on a semi-insulating GaAs substrate 31: n$^+$-GaAs layer 32, n-GaAs layer 33, p$^+$-GaAs layer 34, n-Al$_x$Ga$_{1-x}$As layer 35 (0≦X≦0.3), n Al$_{0.3}$Ga$_{0.7}$As layer 36 and n$^+$-GaAs layer 37. A collector electrode 38 is formed on n$^+$-GaAs layer 32. A base electrode 39 is formed on p$^+$-GaAs layer 34. An emitter electrode 40 is formed on n$^+$-GaAs layer 37.

FIG. 6 shows an energy band of the above described bipolar transistor of FIG. 5 in which the emitter-base junction region has a linearly graded aluminum composition. In the bipolar transistor with the graded emitter-base junction region, a barrier between the emitter and base is released owing to the emitter-base junction region of which the composition is graded linearly or parabolically. In that case, the injected electron density is varied in accordance with the change of applied emitter-base voltage.

FIG. 7 shows a bipolar transistor having an abrupt emitter-base junction region. The bipolar transistor of FIG. 7 has the following layers sequentially formed on a semi-insulating GaAs substrate 51: n$^+$-GaAs layer 52, n-GaAs layer 53, p$^+$-GaAs layer 54, n-Al$_{0.3}$Ga$_{0.7}$As layer 55 and n$^+$-GaAs layer 56. A collector electrode 58 is formed on n$^+$-GaAs layer 52. A base electrode 59 is formed on p$^+$-GaAs layer 54. An emitter electrode 60 is formed on n$^+$-GaAs layer 56.

FIG. 8 shows an energy band of the above described bipolar transistor of FIG. 7 which has the abrupt emitter-base junction region. The bipolar transistor shown in this figure has an emitter-base junction region in which the aluminum composition is changed abruptly, so that electrons come into the base over a barrier from the emitter. In that case, the injected electron density is varied in accordance with the change of applied emitter-base voltage.

The above described bipolar transistors with conventional grading or abrupt emitter-base junction region have carriers (i.e., electrons and holes) at a high density in the emitter-base junction region compared with the collector current density. Accordingly, the possibility of recombination of carriers (SHR recombination) which pass through the energy level of mid gap in this region is quite high. In particular, the possibility is very high at the semiconductor surface where a lot of energy levels exist.

The function of the bipolar transistors of these types are described in detail as follows.

In the case of the NPN-type bipolar transistor with a linear graded emitter-base junction region, a potential well is formed in a conduction band on the emitter side of the emitter-base junction region, so that, there is a reduction in the injection of electrons from the emitter layer into the base layer. Therefore, the electron concentration is increased in the emitter-base junction region.

For a smoothly graded heterojunction at a given collector current density, the electron concentration near the emitter-base junction region is generally quite high because the velocity at which the electrons are injected into the collector is low.

In case of a NPN-type bipolar transistor with an abrupt compositional change at the emitter-base junction region, the concentration of holes in the junction region vicinity becomes very large at a given collector current density owing to the high turn-on voltage of the junction.

SUMMARY OF THE INVENTION

The present invention provides a heterojunction bipolar transistor comprising a collector layer, a base layer, an emitter layer, a transition layer formed between the base layer and the emitter layer, a collector electrode connected to the collector layer, a base electrode connected to the base layer, and an emitter electrode connected to the emitter layer, wherein the emitter layer and the transition layer are formed of a composition including elements forming the base layer and at least one element different from the elements, a composition of the different element in the transition layer at the emitter side is substantially equal to that of the emitter layer, a composition of the different element in the transition layer at the base side is smaller than that of the emitter side and changes abruptly towards the base layer, and the composition of the transition layer gradingly varies from the base side to the emitter side.

The purpose of the present invention is to provide a heterojunction bipolar transistor in which the minority carrier concentrations in the emitter-base junction region are lowered to decrease the surface recombination current, whereby the reliability is hardly deteriorated by surface recombination.

BRIEF DESCRIPTION OF THE DRAWINGS

FIG. 1 is a schematic view in a cross section showing a main part of an embodiment of heterojunction bipolar transistor of the present invention.

FIG. 2 is an energy band of the heterojunction bipolar transistor shown in FIG. 1.

FIG. 3 is a graph showing an aluminum composition in respective layers of the heterojunction bipolar transistor shown in FIG. 1.

DETAILED DESCRIPTION OF THE INVENTION

Figure 4:
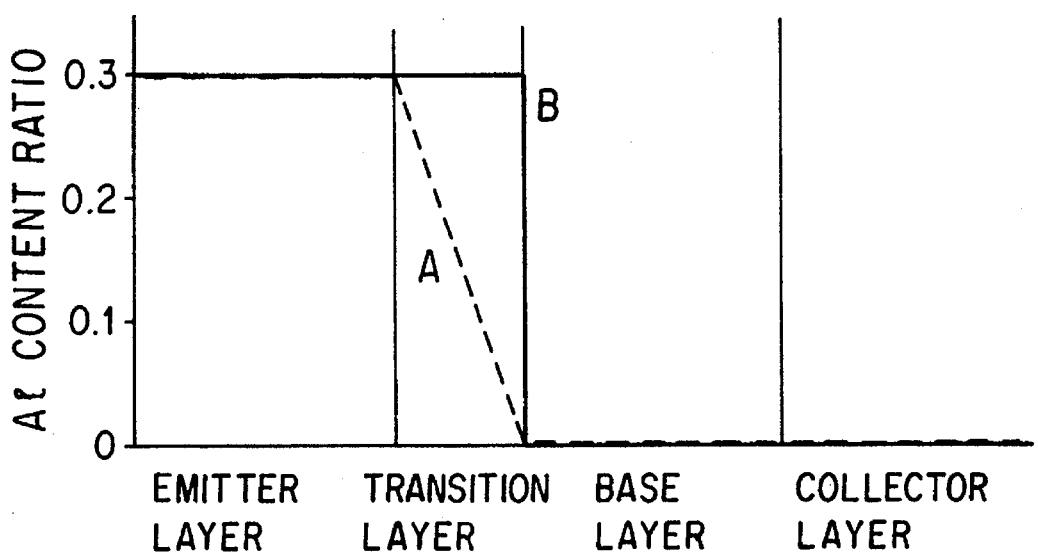
FIG. 4 is a graph showing an aluminum composition in respective layers of a conventional graded or abrupt heterojunction bi-polar transistor.
Figure 5:
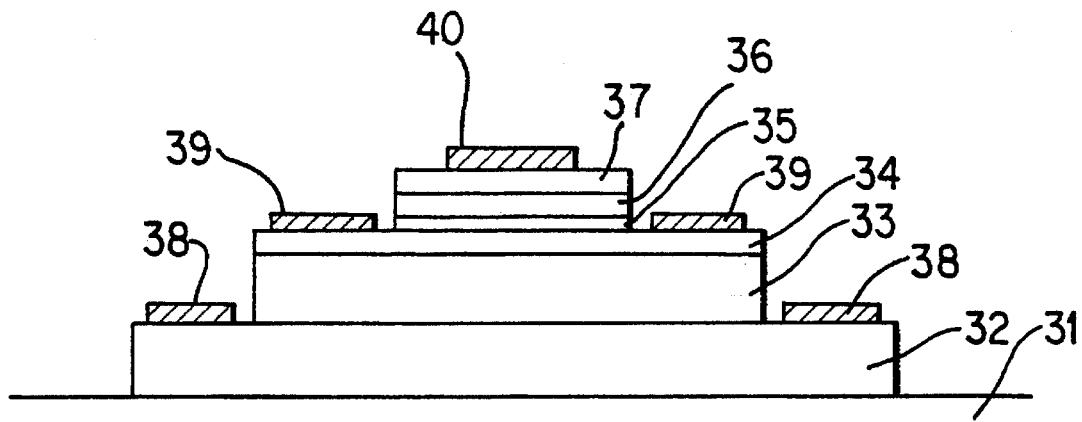
FIG. 5 is a schematic view in a cross section showing a main part of an embodiment of a conventional graded emitter-base junction heterojunction bipolar transistor.
Figure 6:
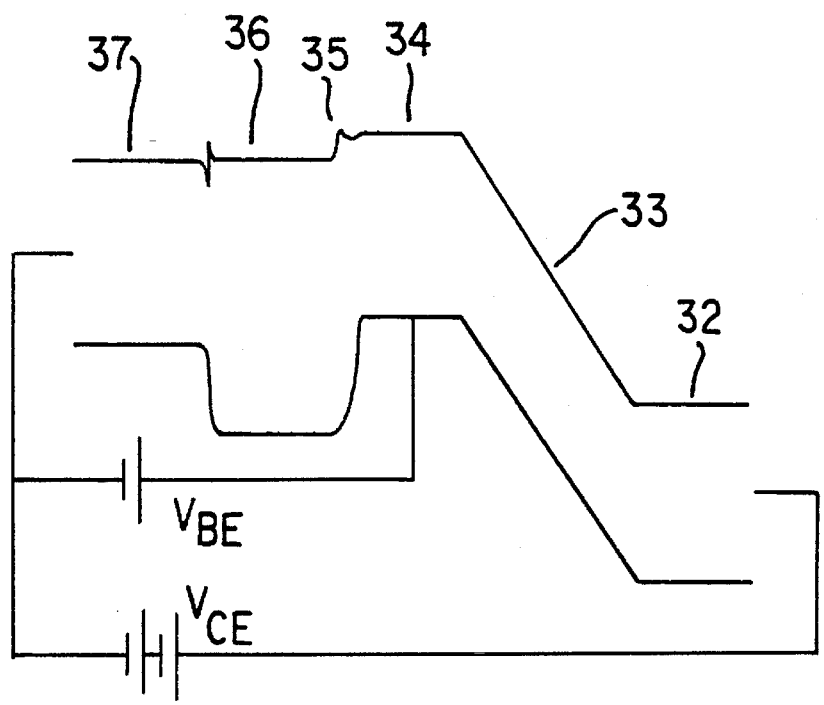
FIG. 6 is an energy band of the heterojunction bipolar transistor in FIG. 5.
Figure 7:
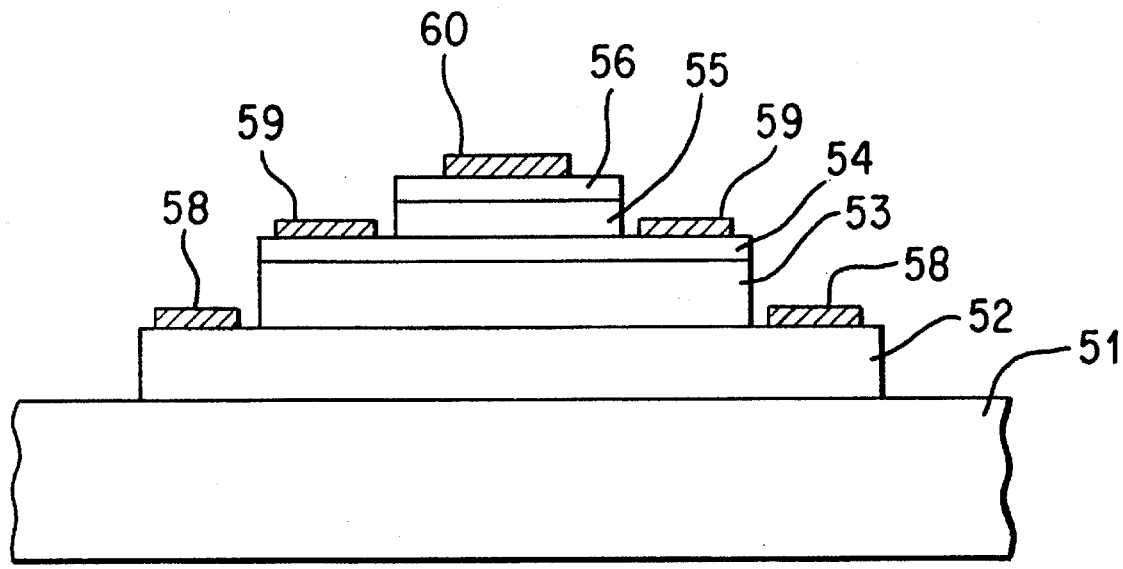
FIG. 7 is a schematic view in a cross section showing a main part of an embodiment of a conventional abrupt emitter-base junction heterojunction bipolar transistor.
Figure 8:
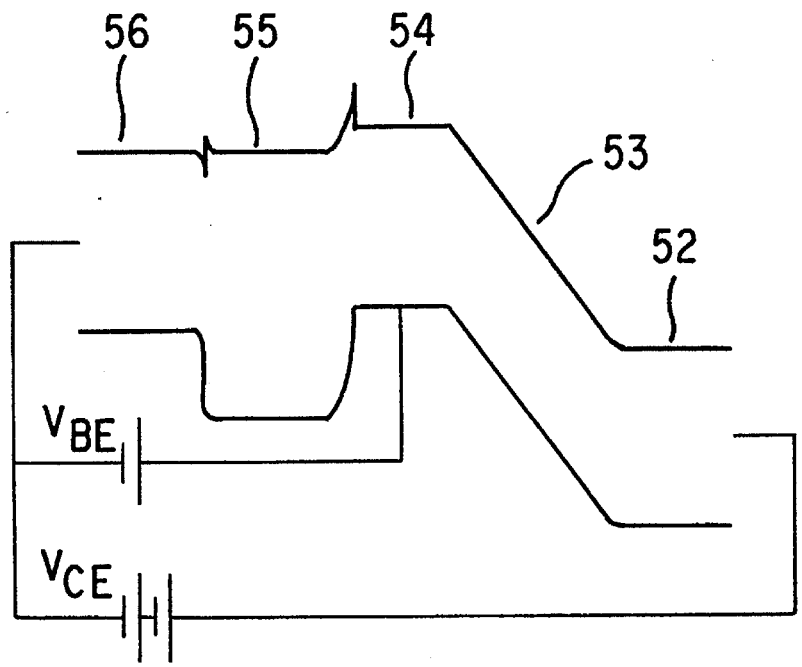
FIG. 8 is an energy band of the heterojunction bipolar transistor shown in FIG. 7.

The heterojunction bipolar transistor of the present invention has at least a collector layer, a base layer, a transition layer and an emitter layer.

The collector layer, base layer, transition layer, and emitter layer are formed on a semiconductor substrate. The substrate may be of a conventional type, for example a semiconductor substrate such as a silicon substrate and a compound semiconductor substrate formed of GaAs, InP, etc. The substrate itself can be used as the collector layer, in which case it is preferable that GaAs is used as the substrate and the other layers (such as the collector layer, base layer, transition layer and emitter layer) are formed thereon. If necessary, a buffer layer, a contact layer or the like can also be formed (in addition to the collector, base, transition and emitter layers).

An emitter electrode, base electrode and collector electrode are connected to the emitter layer, base layer and collector, respectively. If the emitter layer has an emitter contact layer thereon, the emitter electrode may be formed on the emitter contact layer. If the collector layer is formed on a subcollector layer, the collector electrode is connected to the collector layer through the subcollector layer.

According to the present invention, a different element contained in the emitter and transition layers is an element different from those forming the base layer. The different element may form a compound semiconductor together with elements forming the collector, base, transition and emitter layers. For example, the different element includes Al, In and the like doped in the GaAs compound semiconductor.

When a GaAs substrate is used, it is preferable to form a subcollector layer before forming the collector layer on the substrate. In that case, it is preferred that the subcollector layer is formed by $n^+$-GaAs and the collector layer are formed by n-GaAs. The impurities doped in the subcollector layer are n type impurities such as Si, Sn, Ge, S, Se and Te. These impurities are preferably doped in the subcollector layer at a concentration of $2\times10^{18}$ to $8\times10^{18}$ cm$^{-3}$ and in the collector layer preferably at $5\times10^{16}$ cm$^{-3}$ to $1\times10^{17}$ cm$^{-3}$. The preferred thicknesses for the subcollector layer and collector layers are about 0.5 to 1.0 μm and 0.4 to 1.0 μm, respectively.

The base layer is formed on the collector layer. The base layer is preferably formed of $p^+$-GaAs. The preferred impurity doped in the P-type base layer is an impurity such as C (carbon), Be, Zn; its concentration is $5\times10^{18}$ to $5\times10^{19}$ cm$^{-3}$; and the layer thickness is about 0.05 to 0.2 μm.

The transition layer is formed on the base layer and the emitter layer is formed on the transition layer. The transition layer or emitter layer is formed of a composition including the same elements which forms the base layer and at least one element different from the elements forming the base layer. In the transition layer, the composition of the different element is graded from the base side to the emitter side. The different element on the base side of the transition layer is contained such that the composition thereof is abruptly changed between the transition layer and the base layer. The different element on the emitter side is contained at the same composition in the emitter layer.

As an example, when the base layer is formed of GaAs and the emitter layer is n -$Al_yGa_{1-y}As$, the transition layer is preferably $Al_xGa_{1-x}As$. In that case, it is preferred that Y is in the range of about 0.2 to 0.5 and X is graded continuously or discontinuously in the range of about 0.1 to 0.5 from the base layer side to the emitter layer side. The value X on the base side is preferably in the range of $0.1 \leq X \leq 0$ and $X \leq y-0.05$ so as to cause an abrupt change in composition between the transition layer and the base layer. When X on the base side is smaller than 0.1, the composition between the transition layer and the base layer is graded in the manner that the gradation of the composition can not be distinguished from the continuous gradation. Therefore, it is not preferred. While, if X on the base side is greater than 0.25, the composition between the transition layer and the base layer is graded in an excessively abrupt manner, so that it is not preferred.

Specifically, when the base layer is formed of GaAs and the emitter layer is formed of n -$Al_{0.2}Ga_{0.8}As$, X of the composition of the transition layer on the base side is preferably in the range of $0.1 \leq X \leq 0.15$.

When the base layer is formed GaAs and the emitter layer is n -$Al_{0.25}Ga_{0.75}As$, X of the composition of the transition layer on the base side is preferably in the range of $0.1 \leq X \leq 0.2$.

When the base layer is formed of GaAs and the emitter layer is n -$Al_{0.3}Ga_{0.7}As$, X of the composition of the transition layer on the base side is preferably in the range of $0.1 \leq X \leq 0.25$, more preferably in the range of $0.15 \leq X 0.2$.

When the base layer is formed GaAs and the emitter layer is n -$Al_{0.35}Ga_{0.65}As$, X of the composition of the transition layer on the base side is preferably in the range of $0.1 \leq X \leq 0.25$.

When the base layer is formed GaAs and the emitter layer is n -$Al_{0.5}Ga_{0.5}As$, X of the composition of the transition layer on the base side is preferably in the range of $0.1 \leq X \leq 0.25$.

As is seen above, the transition layer is characterized in that the composition is abruptly changed toward the base layer and is consistent with that of the emitter layer on the emitter side. It is preferred that the thickness of the transition layer is about 200 to 500 angstroms and the thickness of the emitter layer is about 0.1 to 0.2 μm. Examples of impurities to be doped in the emitter layer are n type impurities such as Si and Sn. The concentration of the impurity is preferably from $1\times10^{17}$ to $2\times10^{18}$ cm$^{-3}$. An emitter contact layer may be formed on the emitter layer. In that case, the emitter contact layer is preferably formed of $n^+$-GaAs at an impurity concentration from $2\times10^{18}$ to $8\times10^{18}$ cm$^{-3}$ with a thickness of 0.1 to 0.4 μm.

The respective layers of the transistor of the present invention can be epitaxially grown in sequence by a known method such as a metal organic chemical vapor deposition (MOCVD) and molecular beam epitaxial method (MBE). After growing the respective layers, the emitter and emitter contact layers are etched by a known method to expose the base layer, then, the base and collector layers are etched to expose the subcollector layer. Subsequently, an emitter electrode, base electrode and collector electrode are formed on the emitter contact layer, base layer and subcollector layer, respectively. As for the materials of the electrodes, general electrode materials may be used and are not specifically limited. However, AuGe/Ni/Au may be used for the collector and emitter electrodes and Ti/Pt/Au or Cr/Au may be used for the base electrode. In order to improve heat resistance to enhance reliability, it is preferred to use a heat resisting metal including a refractory alloy such as WSi and WN for the emitter electrode, more preferably, WN is used. When using the refractory alloy for the emitter electrode, $N^+$-InGaAs is preferably used for the emitter contact layer. These materials are deposited and laminated by a method such as sputtering, then a desired electrode is formed by a method such as a lift-off method on the desired layers. In that case, the thickness of the collector electrode and base electrode is preferably about 0.05 to 0.2 μm, respectively.

The present invention can be applied to an NPN-type transistor as described above. It may be applied to a PNP-type transistor essentially in the same manner. In the above description, GaAs and AlGaAs were used, but lattice match or lattice mismatch semiconductors such as InGaAs and InP can be also used.

Further, among the transistors having the heterojunction of which the composition is graded continuously or discontinuously as described above, those having a heterojunction of which the composition is graded linearly as well as parabolically is also applicable. However, they are not preferred because epitaxial growth which is performed for forming this type of transistor is complicated and difficult and mobile charge densities are not greatly reduced in the emitter-base region.

According to the heterojunction bipolar transistor of the present invention, a low electron concentration in the emitter-base junction region is provided. This is because the step change in aluminum composition between the emitter and the base causes the electrons to be injected into the base at high velocity and because of the absence of any potential well in the conduction band of the emitter. The hole density in the emitter-base junction region is kept low because the relatively small abrupt compositional change at the emitter-base junction gives a low junction turn-on voltage for a given collector current. The low carrier densities in the emitter-base junction region keep the SHR recombination current at a low level.

EXAMPLES

Examples of the heterojunction bipolar transistor of the present invention are described below with reference to the figures.

As shown in FIG. 1, $n^+$-GaAs subcollector layer 2, n-GaAs collector layer 3, $p^+$-GaAs base layer 4, n-$Al_xGa_{1-x}$As transition layer 5, n $Al_{0.3}Ga_{0.7}$As emitter layer 6 and $n^+$-GaAs emitter contact layer 7 are sequentially formed on a semi-insulating GaAs substrate 1, a collector electrode 8 is formed on the $n^+$-GaAs subcollector layer 2 as an ohmic electrode, a base electrode 9 is formed on $p^+$-GaAs base layer 4 and an emitter electrode 10 is formed on $n^+$-GaAs emitter contact layer 7.

The $n^+$-GaAs subcollector layer 2 is formed with a thickness of about 5,000 angstroms and doped with Si at a concentration of $5\times10^{18}$ cm$^{-3}$. The n-GaAs collector layer 3 is formed with a thickness of about 5,000 angstroms and doped with Si at a concentration of $5\times10^{16}$ cm$^{-3}$. The $p^+$-GaAs base layer 4 is formed with a thickness of about 700 angstroms and doped with C at a concentration of $4\times10^{19}$ cm$^{-3}$. The n-$Al_xGa_{1-x}$As transition layer 5 is formed with a thickness of about 200 angstroms and doped with Si at a concentration of $5\times10^{17}$ cm$^{-3}$ where X is graded linearly from 0.2 to 0.3 from the side of $p^+$-GaAs base layer 4 to the side of n -$Al_{0.3}Ga_{0.7}$As emitter layer 6. The n -$Al_{0.3}Ga_{0.7}$As emitter layer 6 is formed with a thickness of about 800 angstroms and doped with Si at a concentration of $5\times10^{17}$ cm$^{-3}$. The $n^+$-GaAs emitter contact layer 7 is formed with a thickness of about 1,000 angstroms and doped with Si at a concentration of $5\times10^{18}$ cm$^{-3}$. The collector electrode 8 and emitter electrode 10 are formed of AuGe/Ni/Au and the base electrode 9 is formed of Ti/Pt/Au.

Next, a manufacturing method for the heterojunction bipolar transistor of the present invention is described.

First, the $n^+$-GaAs subcollector layer 2, n-GaAs collector layer 3, $p^+$-GaAs base layer 4, n-$Al_xGa_{1-x}$As transition layer 5, n -$Al_{0.3}Ga_{0.7}$As emitter layer 6 and n -GaAs emitter contact layer 7 are sequentially formed on the semi-insulating GaAs substrate 1.

Then, the n-$Al_xGa_{1-x}$As transition layer 5, n -$Al_{0.3}Ga_{0.7}$As emitter layer 6 and $n^+$-GaAs emitter contact layer 7 are etched to expose the base layer. Subsequently, n-GaAs collector layer 3 and $p^+$-GaAs base layer 4 are etched to form the layers in a desired shape.

Next, AuGe/Ni/Au are deposited for the collector electrode 8 and emitter electrode 10 and Ti/Pt/Au are deposited for the base electrode 9, and they are allowed to be lifted off to form the respective electrodes on the subcollector layer 2, the emitter contact layer 7 and the base layer 4, respectively. Finally, $N^+$-GaAs subcollector 2 is etched to form the bipolar transistor.

The energy band of thus formed heterojunction bipolar transistor is shown in FIG. 2.

FIG. 3 shows the change of an aluminum composition in the respective layers of the above heterojunction bipolar transistor. In FIG. 3, the aluminum composition in the transition layer is equal to that of the emitter layer, 0.3, on the emitter side, and varies linearly towards the base layer from 0.3 to 0.2 of Al content and abruptly at the interface between the transition layer and the base layer.

In the above bipolar transistor, AuGe/Ni was used for the emitter electrode. In order to improve heat resistance to enhance reliability, the emitter electrode is formed of WN and the emitter contact layer 7 is formed of $N^+$-InGaAs, and doped with Si at the concentration of $1\times10^{19}$ to $3\times10^{19}$ cm$^{-3}$. The cumulative failure rate in accordance with time was examined when bias voltage is applied to this bipolar transistor and the conventional bipolar transistor having the graded or abrupt emitter-base junction region under the condition that the temperature is 175° C. temperature at the emitter-base junction region is 295° C. and collector current density Jc=$5\times10^4$ A cm$^{-2}$. The results are shown in Table 1. The transistors are considered to have failed when the current gain $h_{FE}$ is out of the range of ±20% from the initial value under the condition of the above described collector current density Jc. Incidentally, the conventional bipolar transistor is the same structure except for the structure corresponding to the transition layer of the invention.

TABLE 1

|  | 250 hours | 500 hours | 1000 hours |
| --- | --- | --- | --- |
| Example | 0% | 20% | 30% |
| Bipolar transistor w/conventional grading structure | 50% | 60% | 70% |
| Bipolar transistor w/conventional abrupt structure | 40% | 50% | 70% |

As is seen from Table 1, the transistor of the present invention has an extremely high reliability.

The heterojunction bipolar transistor of the present invention comprising a collector layer, a base layer, an emitter layer, a transition layer formed between the base layer and the emitter, a collector electrode connected to the collector layer, a base electrode connected to the base layer, and an emitter electrode connected to the emitter layer, wherein the emitter layer and the transition layer are formed of a composition including elements forming the base layer and at least one element different from the elements, a composition of the different element in the transition layer at the emitter side is substantially equal to that of the emitter layer, a composition of the different element in the transition layer at the base side is smaller than that of the emitter side and varies abruptly towards the base layer, and the composition of the transition layer gradingly varies from the base side-to the emitter side, whereby a carrier density in the emitter-base junction region is lowered and SHR recombination current can be kept at a low level. At the emitter-base junction surface, where there are many mid bandgap energy states, a large recombination current density causes a degradation in the semiconductor surface condition, leading to a reliability problem in structures with high carrier densities in the emitter-base junction region. In the heterojunction bipolar transistor of the invention, surface-recombination related reliability problems are reduced.

What we claimed is:

1. A heterojunction bipolar transistor comprising:

a collector layer, a base layer, an emitter layer, a transition layer formed between the base layer and the emitter layer, a collector electrode electrically connected to the collector layer, a base electrode electrically connected to the base layer, and an emitter electrode electrically connected to the emitter layer, wherein:

the emitter layer and the transition layer are formed of a composition including elements forming the base layer and at least one element different from the elements forming the base layer, a composition ratio of the different element in the transition layer at the emitter side is substantially equal to that of the emitter layer, a composition ratio of the different element in the transition layer at the base side is smaller than, but still greater than or equal to half of, that of the emitter side and varies abruptly towards the base layer, and the composition ratio of the transition layer gradingly varies from the base side to the emitter side.

2. A heterojunction bipolar transistor according to claim 1, in which:

the collector and base layers are formed of GaAs, the emitter layer is formed of $Al_{0.3}Ga_{0.7}As$, and the transition layer is formed of $Al_xGa_{1-x}As$, where X is in the range of 0.15 to 0.25 on the base side.

3. A heterojunction bipolar transistor according to claim 1, in which:

the collector and base layers are formed of GaAs, the emitter layer is formed of $Al_{0.3}Ga_{0.7}As$, and the transition layer is formed of $Al_xGa_{1-x}As$, where X is graded linearly from 0.2 to 0.3 from the base side to the emitter side.

4. A heterojunction bipolar transistor according to any one of claims 1 to 3, in which:

the collector and emitter electrodes are AuGe/Ni/Au, and the base electrode is Ti/Pt/Au.

5. A heterojunction bipolar transistor according to any one of claims 1 to 3, in which:

a subcollector layer is further provided for connecting the collector electrode with the collector layer.

6. A heterojunction bipolar transistor according to any one of claims 1 to 3, in which:

an emitter contact layer is further provided for connecting the emitter electrode with the emitter layer.

\* \* \* \* \*